United States Patent
Roedle et al.

(10) Patent No.: US 8,012,818 B2
(45) Date of Patent: Sep. 6, 2011

(54) METHOD FOR IMPROVING INVERSION LAYER MOBILITY IN A SILICON CARBIDE MOSFET

(75) Inventors: Thomas C. Roedle, Nijmegen (NL); Elnar O. Sveinbjornsson, Gothenburg (SE); Halldor O. Olafsson, Reykjavik (IS); Gudjon I. Gudjonsson, Gothenburg (SE); Carl F. Allerstam, Gothenburg (SE)

(73) Assignee: NXP B.V., Eindhoven (NL)

( * ) Notice: Subject to any disclaimer, the term of this patent is extended or adjusted under 35 U.S.C. 154(b) by 128 days.

(21) Appl. No.: 12/439,584

(22) PCT Filed: Aug. 29, 2007

(86) PCT No.: PCT/IB2007/053484
§ 371 (c)(1),
(2), (4) Date: Mar. 2, 2009

(87) PCT Pub. No.: WO2008/026181
PCT Pub. Date: Mar. 6, 2008

(65) Prior Publication Data
US 2010/0006860 A1 Jan. 14, 2010

(30) Foreign Application Priority Data
Sep. 1, 2006 (EP) .................................. 06119975

(51) Int. Cl.
*H01L 21/336* (2006.01)
*H01L 21/8234* (2006.01)
(52) U.S. Cl. ... 438/197; 438/510; 438/931; 257/E21.17; 257/E21.042; 257/E21.051; 257/E21.054; 257/E21.077; 257/E21.134; 257/E21.319; 257/E21.421

(58) Field of Classification Search .................. 438/197, 438/475, 513, 535, 289, 680, 753, 770, 931; 257/E21.17, 42, 51, 54, 77, 134, 319, 329, 257/421
See application file for complete search history.

(56) References Cited

U.S. PATENT DOCUMENTS
5,648,282 A * 7/1997 Yoneda .......................... 438/305
(Continued)

FOREIGN PATENT DOCUMENTS
WO 02/29874 A 4/2002

OTHER PUBLICATIONS
Opila, E. J., "Oxidation Kinetics of Chemically Vapor-Deposited Silicon Carbide in Wet Oxygen", J. Am. Ceram. Soc, vol. 77, No. 3, pp. 730-736, (Mar. 1994).
(Continued)

*Primary Examiner* — David Nhu

(57) ABSTRACT

A method of manufacturing a semiconductor device based on a SiC substrate involves forming an oxide layer on a Si-terminated face of the SiC substrate at an oxidation rate sufficiently high to achieve a near interface trap density below $5 \times 10^{11}$ cm$^{-2}$; and annealing the oxidized SiC substrate in a hydrogen-containing environment, to passivate deep traps formed in the oxide-forming step, thereby enabling manufacturing of a SiC-based MOSFET having improved inversion layer mobility and reduced threshold voltage. It has been found that the density of DTs increases while the density of NITs decreases when the Si-face of the SiC substrate is subject to rapid oxidation. The deep traps formed during the rapid oxidation can be passivated by hydrogen annealing, thus leading to a significantly decreased threshold voltage for a semiconductor device formed on the oxide.

9 Claims, 5 Drawing Sheets

U.S. PATENT DOCUMENTS

| | | | | |
|---|---|---|---|---|
| 5,972,801 | A | * | 10/1999 | Lipkin et al. ............... 438/931 |
| 6,265,326 | B1 | * | 7/2001 | Ueno ........................... 438/767 |
| 2002/0102358 | A1 | | 8/2002 | Das et al. |
| 2005/0245034 | A1 | | 11/2005 | Fukuda et al. |
| 2010/0193799 | A1 | * | 8/2010 | Nakano et al. ............... 257/77 |

OTHER PUBLICATIONS

Fukuda, K. et al., "Reduction of Interface-State Density in 4H-SiC n-type Metal-Oxide-Semiconductor Structures using High-Temperature Hydrogen Annealing", American Institute of Physics, vol. 76, No. 12, pp. 1585-1587, (Mar. 20, 2000).

Okuno, E. et al., "Reduction of Interface Trap Density in 4H-SiC MOS by High-Temperature Oxidation", Materials Science Forum vols. 389-393, pp. 989-992 (2002).

Senzaki, J. et al., "Excellent Effects of Hydrogen Postoxidation Annealing on Inversion Channel Mobility of 4H-SIC MOSFET Fabricated on (1 1 2 0) Face", IEEE Electron Device Letters, vol. 23, No. 1, pp. 13-15, (Jan. 1, 2002).

Suzuki, S. et al., "Correlation Between Channel Mobility and Shallow Interface Traps in SiC Metal-Oxide-Semiconductor Field-Effect Transistors", J. Applied Physics, vol. 92, No. 10, pp. 6230-6234, (Nov. 15, 2002).

Allerstam F. et al., "High Field-Effect Mobility in 6H-SIC MOSFET with Gate Oxides Grown in Alumina Environment", Materials Science Forum, vol. 483-485, pp. 837-840, (2005).

Rudenko, T. E. et al., "Interface Trap Properties of Thermally Oxidized n-type 4H-Sic and 6H-SiC", Solid-State Electronics 49, pp. 545-553, (2005).

* cited by examiner

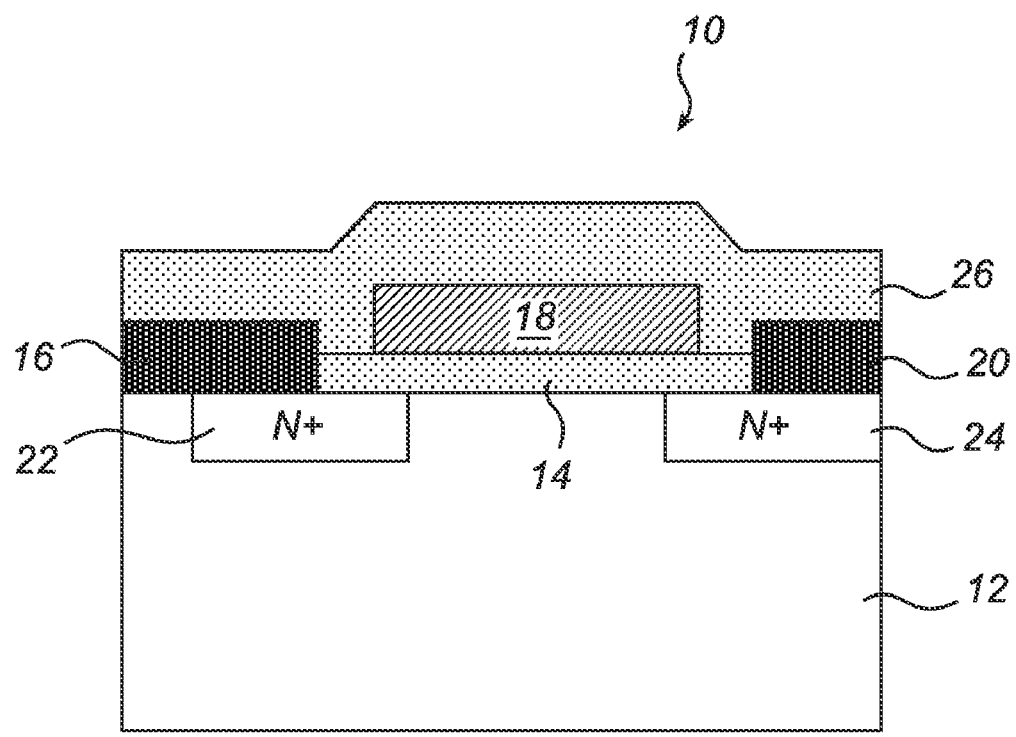
Fig. 1
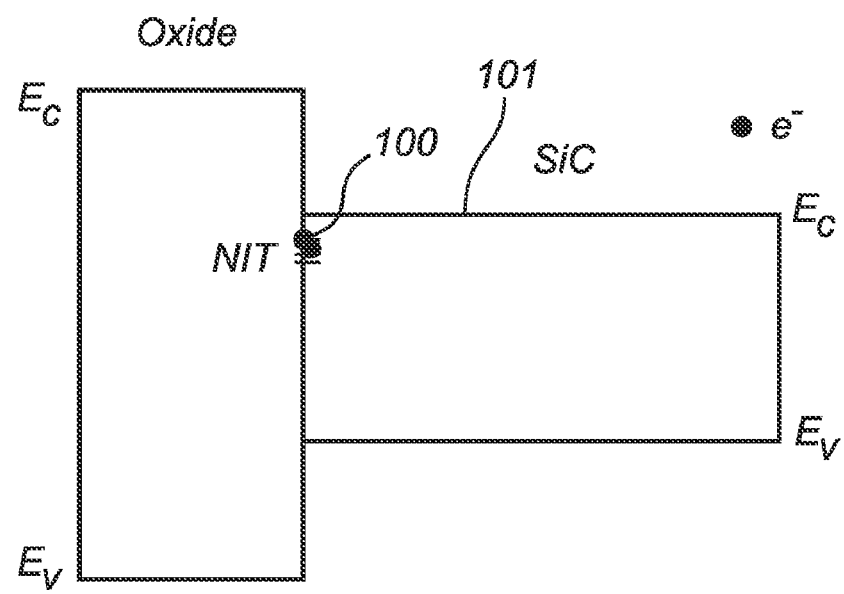
(Prior art) Fig. 2

METHOD FOR IMPROVING INVERSION LAYER MOBILITY IN A SILICON CARBIDE MOSFET

TECHNICAL FIELD OF THE INVENTION

The present invention generally relates to a method for improving inversion layer mobility in a silicon carbide (SiC) metal-oxide semiconductor field-effect transistor (MOSFET). In particular, the present invention relates to forming a gate oxide on the Si-face of a SiC substrate to yield a MOSFET with improved inversion layer mobility.

TECHNICAL BACKGROUND

Silicon (Si) is, and has been, the most popular and widely used semiconductor material for the past thirty years. During this time, Si device technology has reached an advanced level because of constant refinements and improvements. The result of this constant improvement has brought silicon power devices to such levels of efficiency that they are now approaching the theoretical maximum power limit predicted for this material. This means that further refinements in device design and processing are not likely to yield substantial improvements in performance. However, this state of affairs is not acceptable for a variety of current or future applications where silicon power-devices function with heavy operating losses. To allay this situation, materials scientists have been considering various wide bandgap semiconductors as replacements for silicon.

Silicon Carbide (SiC) is an ideal semiconductor material for high voltage, high frequency and high temperature applications. This is primarily due to the large critical electric field (10 times higher than that of Si), large bandgap (3 times that of Si), large thermal conductivity (4 times that of Si), and large electron saturation velocity (twice that of Si) of SiC. These properties make SiC an ideal replacement of Si for making devices such as MOSFETs. SiC n-channel enhancement mode MOSFETs (herein referred to as SiC MOSFETs) are ideal for applications operating at high voltage, high speed and high frequency.

In order to use silicon carbide for metal-oxide-semiconductor field effect transistors, an oxide layer is formed on a SiC substrate. The oxide can be formed on the C-face or the Si-face of the SiC crystal. However, epitaxial layers grown on the C-face are currently not commercially available, and it is therefore desired to form the gate oxide on the Si-face.

However, SiC MOSFETs currently fabricated on the Si-face of a SiC substrate have shown very poor inversion layer mobility (~1 cm$^2$/Vs), which is one hundred times lower than the expected mobility value. This results in large power dissipation and loss of efficiency, which makes SiC MOSFETs less attractive in comparison to their Si counterparts. The lower inversion layer mobility is primarily due to the poor interface between the gate oxide and the silicon carbide substrate through which the current conduction occurs. Specifically, the interface between the gate oxide and the SiC substrate has a large number of interface traps which in various ways interact with the electrons moving through the inversion channel.

In the article "Reduction of Interface Trap Density in 4H—SiC MOS by High-Temperature Oxidation", by Eiichi Okuno and Shinji Amano, Materials Science Forum Vols. 389-393, 2002, it is disclosed that this problem can be mitigated by performing the oxidation rapidly. This results in a lower density of near interface traps, that is traps with interface energy near the conduction band edge.

However, when implementing rapid oxidation of SiC, a negative side effect is that the threshold voltage of the semiconductor device increases.

OBJECTS OF THE INVENTION

It is an object of the present invention to mitigate the above problem, and provide an oxide layer on the Si-face of a SiC substrate which, when used for manufacturing a semiconductor device, will result in improved inversion channel mobility, but with a sufficiently low threshold voltage.

SUMMARY OF THE INVENTION

This and other objects are achieved by a method of manufacturing a semiconductor device based on a SiC substrate, comprising the steps of forming an oxide layer on a Si-terminated face of the SiC substrate at an oxidation rate sufficiently high to achieve a near interface trap density below $5 \times 10^{11}$ cm$^{-2}$; and annealing the oxidized SiC substrate in a hydrogen-containing environment, in order to passivate deep traps formed in the oxide-forming step, thereby enabling manufacturing of a SiC-based MOSFET having improved inversion layer mobility and reduced threshold voltage.

By "near interface traps" (NITs) should, in the context of the present application, be understood interface traps located at a distance of 0.1 to 0.8 eV from the conduction band edge of the SiC substrate.

A suitable method for determining the density of NITs at the oxide-SiC interface is the well-known thermal dielectric relaxation current technique (TDRC), which is described in the following reference: T. E. Rudenko, I. N. Osiyuk, I. P. Tyagulski, H. Ö. Ólafsson, and E. Ö. Sveinbjörnsson: Solid State Electr. Vol. 49 (2005), p. 545.

The invention is based on the realization that the above-mentioned increased threshold voltage is a result of an increased flatband voltage, in turn caused by an increased density of "deep traps" (DTs), that is traps with an interface energy close to the middle of the SiC bandgap (typically 0.8-2 eV from the conduction band edge). It has been found by the present inventors that the density of DTs increases while the density of NITs decreases when the Si-face of the SiC substrate is subject to rapid oxidation. According to the present invention, the deep traps formed during the rapid oxidation can be passivated by hydrogen annealing, thus leading to a significantly decreased threshold voltage for a semiconductor device formed on the oxide.

Post oxidation annealing (POA) of oxide formed on SiC has been proposed in the prior art, for example in "Excellent effects of Hydrogen Postoxidation Annealing on Inversion Channel Mobility of 4H—SiC MOSFET Fabricated on (1120) Face", by Junji Senzaki, et al., IEEE Electr. Dev. Lett., vol 23, January 2002. However, this article is related to the a-face of SiC, which is perpendicular to the commercially used Si face, and the effects of hydrogen POA were discussed mainly in relation to channel mobility. The same article mentions that the authors in earlier work concerning the Si-face of SiC have reported that hydrogen POA reduces the density of NITs. Therefore, the skilled person would have no reason to suspect that hydrogen POA would reduce deep interface traps on the Si-face. Further, the skilled person would hardly seek to reduce the number of deep traps in order to lower the threshold voltage of the semiconductor device. In fact, the occurrence of DTs at the SiC-oxide interface is, to the best of the inventors' knowledge, previously unknown.

The oxidation rate may have a maximum which is at least 700 Angstrom per hour at a temperature of 1150° C. It is preferred that the oxidation rate is at least five times higher than the maximum oxidation rate achieved through conventional oxidation at the same temperature, for example using the following parameters: oxidation at 1 atmosphere using oxygen gas with flow rate of 30 standard cubic centimeters per minute.

For such an elevated oxidation rate, it has been demonstrated by the present inventors that the inversion layer mobility increases by a factor of 10 to 100 compared to oxidation using conventional process parameters.

The sufficiently high oxidation rate may advantageously be achieved by means of an oxidation rate enhancing agent.

Such an oxidation rate enhancing agent may be any substance capable of increasing the rate of oxidation on the Si-face of a SiC substrate, and such a substance may be utilized in a variety of ways, some of which are described below.

It may be possible to increase the "natural oxidation rate" to a sufficiently high oxidation rate without the use of an oxidation enhancing agent, for example by performing oxidation at a higher temperature and/or higher pressure. This would, however, require a very high temperature (1300-1400° C.) which would severely limit the range of useable equipment, such as furnaces, holding fixtures (so-called "boats") etc. Furthermore, formation of an oxide at the Si-face of the SiC substrate at such an elevated temperature would result in a very limited process latitude, which would be expected to have a detrimental effect on the resulting component yield.

The oxidation rate enhancing agent may be introduced in an oxidation chamber during oxidation of the Si-terminated face of the SiC substrate.

Such an introduction of the oxidation rate enhancing agent may be performed in various ways, such as, for example, inserting a solid object containing the oxidation rate enhancing agent in the oxidation chamber during oxidation, feeding vapor (for example water vapor) contaminated with the oxidation rate enhancing agent to the oxidation chamber, or soaking the SiC substrate in a solution containing the oxidation enhancing agent prior to oxidation.

The oxidation enhancing agent may also be administered in other ways, such as through ion implantation on the surface of the SiC substrate to be oxidized. In the case of ion implantation, the primary reason for the enhanced oxidation rate is lattice damage due to the implantation. In some cases the presence of the implanted elements can also influence the oxidation rate. The use of native element like Si may be especially advantageous, since there are then no contaminants present which may potentially need to be removed through further processing.

The oxidation rate enhancing agent may be an alkali metal. A sufficiently high oxidation rate may be achieved through oxidation in the presence of alkali metals, such as sodium, potassium and rubidium.

Additionally, oxidation in the presence of metallic impurities, such as Fe, Cr, Cu, Co, Ni and Ti may lead to a sufficiently high oxidation rate.

Especially sodium (Na) has proven to speed up the oxidation process to a sufficiently high oxidation rate to reduce the number of near interface traps (NITs) to such a level ($<5\times10^{11}$ $cm^{-2}$) that the inversion layer mobility is improved by a factor of 10-100 compared to what can be achieved through a conventional oxidation procedure.

According to one embodiment of the present invention, the oxide-forming step may comprise the steps of providing the SiC substrate in an oxidation chamber; and introducing sodium into the oxidation chamber during oxidation of a Si-terminated face of the SiC-substrate to thereby achieve a sufficiently high oxidation rate to reduce the density of near interface traps to below $5\times10^{11}$ $cm^2$.

Through the introduction of sodium in the oxidation chamber a sufficiently high oxidation rate is achieved, which leads to the previously mentioned much improved inversion layer mobility. Furthermore, sodium ions migrate at the SiC-oxide interface to cancel the deep traps (DTs) formed during the rapid oxidation. In order to achieve stable operation of the SiC MOSFET, however, mobile sodium ions need to be removed from the oxide-SiC interface. This may, for example, be achieved by selecting suitable operating conditions in the annealing step according to the present invention.

Alternatively, the annealing step may comprise the steps of subjecting the oxidized SiC substrate to a first post-oxidation anneal in an inert gas, to reduce an amount of mobile sodium in the oxidized SiC substrate; and subjecting the sodium reduced oxidized SiC substrate to a second post-oxidation anneal in a hydrogen-containing environment, in order to passivate the deep traps.

The first post-oxidation anneal (POA) may be performed in a substantially inert ambient, such as an Ar- or $N_2$-based environment. Through this first POA, the sodium diffuses out of the oxide. Optionally, the first POA may be followed by etching a few nm of the oxide in order to remove sodium accumulated at the oxide surface. The first POA is followed by a second POA in order to passivate the now uncompensated DTs with hydrogen.

As an alternative to the above-described first POA, the sodium may be removed by means of an electric field according to the following procedure: The oxide layer as well as the backside of the SiC-substrate is covered with metal, such as aluminum. The sample is then heated and subjected to UV light, while an electric field of 1-2 MV/cm is applied between the pads. The sample is then cooled down to room temperature under bias. This results in virtually all the sodium drifting towards the aluminum/oxide interface. In the next step the Al top layer is removed and 50 nm of the oxide is removed in buffered HF solution.

According to a second aspect of the present invention, the above-mentioned objects are achieved by a semiconductor device comprising a SiC substrate having a Si-terminated face; and an oxide layer formed on the Si-terminated face of the SiC substrate, wherein a concentration of near interface traps at an interface between the SiC substrate and the oxide is lower than $5\times10^{11}$ $cm^{-2}$; and a concentration of passivated deep traps at the interface is in excess of $10^{12}$ $cm^{-2}$.

The features and advantages of this second aspect are largely analogous to those described above in connection with the first aspect of the present invention.

Furthermore, the semiconductor device according to the present invention may advantageously be comprised in a SiC-based MOSFET.

BRIEF DESCRIPTION OF THE DRAWINGS

These and other aspects of the present invention will now be described in more detail, with reference to the appended drawings showing currently preferred embodiments of the invention, wherein:

FIG. 1 depicts an enhancement mode NMOS SiC-MOSFET according to the present invention;

FIG. 2 is a simplified energy level diagram schematically illustrating the situation at the SiC-oxide interface after conventional oxidation;

DETAILED DESCRIPTION OF PREFERRED EMBODIMENTS OF THE INVENTION

Figure 3:
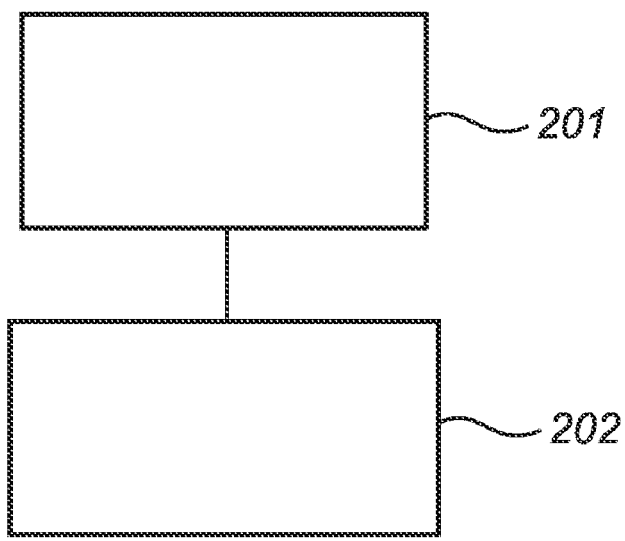
FIG. 3 is a flow-chart schematically illustrating the method according to the present invention.

It is noted that the drawings of the invention are not necessarily to scale. The drawings are merely schematic representations, not intended to portray specific parameters of the invention. The drawings are intended to depict only typical embodiments of the invention, and therefore should not be considered as limiting the scope of the invention. In particular, the method according to the present invention is described with reference to an embodiment, in which an oxidation enhancing agent, here sodium, is introduced during oxidation in order to increase the oxidation rate to a sufficiently high level. It should be noted that it is the oxidation rate as such in combination with the hydrogen passivation that are central to the present invention. Consequently, the present invention is equally applicable to a process involving any other way of accomplishing the desired oxidation rate, such as introduction of other alkali metals, such as potassium or rubidium, introduction of other metallic impurities, ion implantation in the SiC substrate prior to oxidation or in other ways tuning the oxidation parameters (such as temperature and/or pressure) to achieve the sufficiently high oxidation rate. In the drawings, like numbering represents like elements.

Referring now to FIG. 1, an enhancement type NMOS device 10 is depicted. NMOS 10 generally comprises a SiC p-type doped substrate 12, oxide layer 14 (sometimes referred to as gate oxide), source contact 16, gate contact 18, drain contact 20, n+ doped source region 22, n+ doped drain region 24, and passivation layer 26. As depicted, source contact 16 and drain contact 20 are in electrical contact with source region 22 and drain region 24, respectively. It should be understood that regions 22 and 24, and contacts 16, 18, and 20 can be formed using any means known in the art and are not intended to be a limiting feature of this invention. For example, contacts 16, 18, and 20 could be deposited metal (for example, aluminum). Alternatively, gate contact 18 could be polycrystalline silicon applied using a chemical vapor deposition (CVD) process. In the case of the latter, an additional oxide layer could also be provided, via CVD, over the top and side surfaces of gate contact 18.

As discussed above, SiC MOSFETs such as device 10, often exhibit poor inversion layer mobility. Inversion layer mobility refers to the mobility of electrons from source region 22 to drain region 24. The present invention improves the interface between oxide layer 14 and substrate 12 by forming oxide layer 14 at a high oxidation rate and subsequently passivating the deep traps (DTs) formed during the rapid oxidation by means of post oxidation anneal (POA) in the presence of hydrogen. The result is a significant improvement in inversion layer mobility, as will be further illustrated below in conjunction with FIG. 6.

In a conventional oxidation procedure, the growth of oxide layer 14 involves heating SiC substrate 12 in a chamber (for example, a furnace) to the desired temperature. Once heated, a gaseous mixture of hydrogen ($H_2$) and oxygen ($O_2$) (that is, an oxidizing ambient) are introduced into the chamber. In the chamber, the gaseous mixture forms pyrogenic steam, which oxidizes the top surface of SiC substrate 12 to form gate oxide 14. This is known as wet oxidation. Alternatively, another form of wet oxidation can be performed by introducing nitrogen ($N_2$) or oxygen ($O_2$) bubbled through hot de-ionized water into the heated furnace. Similar to the gaseous mixture of hydrogen and oxygen, the nitrogen saturated with water vapor oxidizes the top surface of SiC substrate 12 to form gate oxide 14. Alternatively so-called dry oxidation can be used where oxygen ($O_2$) gas alone is introduced into the chamber to form the oxide on the SiC substrate.

FIG. 2 schematically illustrates the situation at the oxide-SiC interface following conventional oxidation of the Si-face of 4H—SiC.

In FIG. 2, the dominant interface traps 100 are indicated near the conduction band edge 101 of the SiC-substrate. Following conventional oxidation of the Si-face the near interface traps (NITs) 100 are typically present at a density of around $10^{13}$ cm$^{-2}$. The NITs 100 trap most of the electrons available in an inversion layer in a MOSFET and a low mobility (1 cm$^2$/Vs) is observed. The deep traps (DT) have densities in the low $10^{11}$ cm$^{-2}$ range and are not shown.

In FIG. 3 which is a flow-chart schematically illustrating the method according to the present invention, an oxide is formed on the Si-face of a SiC-substrate in a first step 201, at a sufficiently high oxidation rate (typically at least 700 Angstrom per hour at 1150° C.) to achieve a surface concentration of near interface traps (NITs) below $5 \times 10^{11}$ cm$^{-2}$. It has been found by the present inventors that the rapid oxidation leads to a formation of so-called deep traps (DTs). These DTs have only marginal influence on the inversion layer mobility, but lead to a large threshold voltage for the device (around 20-40 V). In order to enable the formation of a stable SiC MOSFET having a high inversion layer mobility and a low threshold voltage, the oxidized SiC-substrate is subsequently annealed in a hydrogen containing environment, in step 202. By selecting suitable anneal parameters for this hydrogen anneal, the DTs formed in the rapid oxidation in step 201 can be passivated without significantly increasing the concentration of NITs or introducing any element having a detrimental effect on the stability of the device with respect to, for example, temperature and/or exposure to light.

With reference to the flow-chart in FIG. 4 and the simplified energy level diagrams in FIGS. 5a-5c, a first embodiment of the method according to the present invention will be described.

Figure 4:
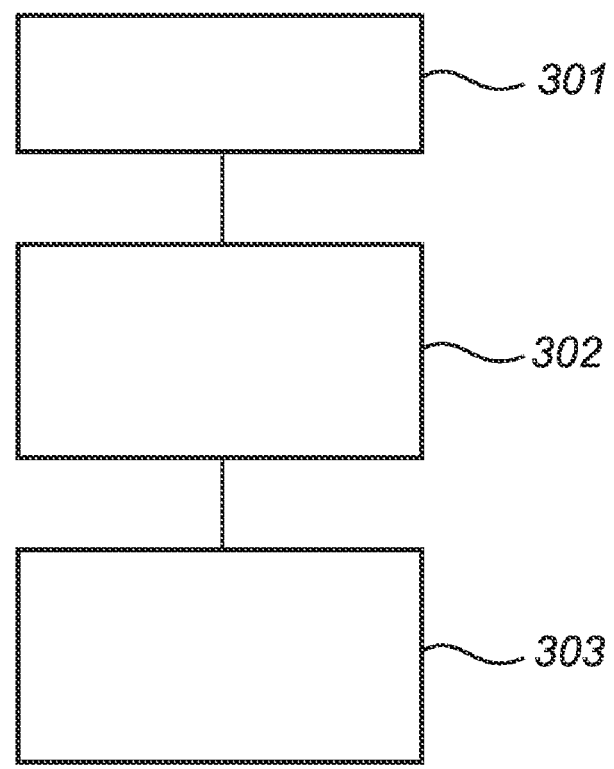
FIG. 4 is a flow-chart schematically illustrating a first embodiment of the method according to the present invention.

In FIG. 4, a first embodiment of the method according to the invention is illustrated, where a SiC-substrate is provided in an oxidation chamber in a first step 301. In a subsequent step 302, an oxidation rate enhancing agent, here in the form of sodium, is introduced in the oxidation chamber. The sodium can be introduced into the oxidation chamber during oxidation by any one of several proven methods:

(i) A piece of sintered alumina or an alumina carrier boat is inserted into the oxidation chamber during oxidation. The sodium is present as a contamination in the sintered alumina and diffuses to the SiC surface during oxidation.

(ii) Sodium is introduced by feeding sodium contaminated water vapor into the oxidation chamber during oxidation. This may be done by bubbling nitrogen through de-ionized water that is deliberately contaminated with sodium.

(iii) The SiC samples are soaked into sodium containing solution and thereafter loaded into the oxidation chamber for oxidation.

Figure 5A:
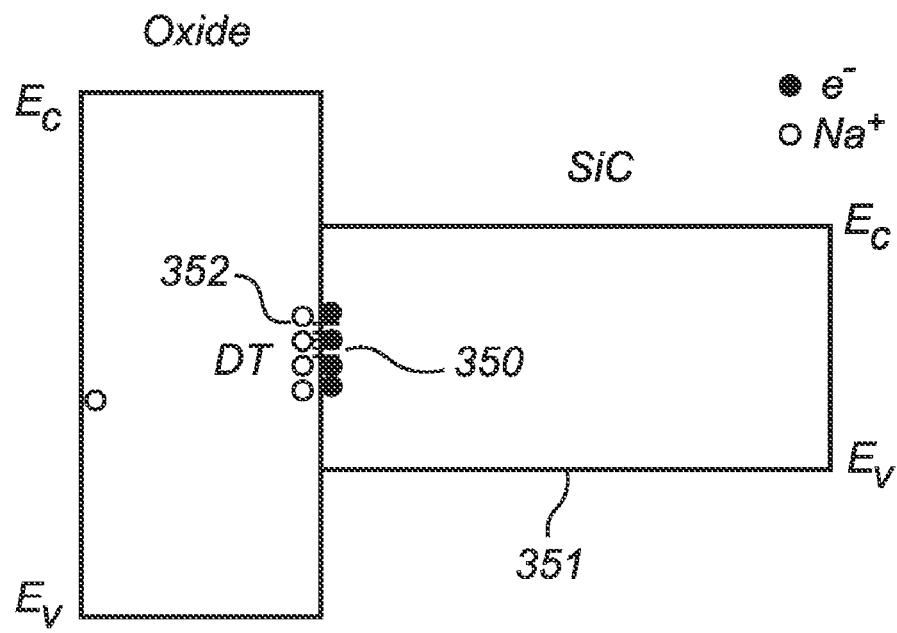
FIGS. 5a-5c are simplified energy level diagrams schematically illustrating the situation at the SiC-oxide interface after different steps in the first embodiment of the method according to the present invention.

Referring now to FIG. 5a, the situation at the oxide-SiC interface is schematically illustrated after completion of the oxidation process described above. As illustrated, the majority of interface traps 350 are now present at energy levels closer to the valence band 351 of the SiC than was the case following conventional oxidation (cf FIG. 2). The interface traps 350 shown in FIG. 5a are the deep traps (DT) having an interface trap density of around $10^{13}$ cm$^{-2}$. The near interface traps (NITs) are now present having densities in the low $10^{11}$ cm$^{-2}$ range and are not shown. Following oxidation, the DTs are filled with electrons and then compensated by sodium ions 352. The compensation takes place during cooling of the sample starting at approximately 200° C. The amount of sodium within the oxide is to a first order equal to the concentration of DTs. If the procedure were terminated at this stage (following step 302) a MOSFET made using this oxide would show high channel mobility since the NIT density is insignificant. Furthermore, since the DTs are compensated by sodium, they do not affect the device performance (a low threshold voltage is achieved). However, negative gate bias at room temperature would result in transfer of sodium away from the oxide-SiC interface towards the metal-oxide interface. This would leave behind negatively charged DTs resulting in large flatband voltage shifts. When other oxidation rate enhancing agents having lower mobility than sodium are used, the oxidation rate enhancing agent ions are typically unable to diffuse through the oxide layer and compensate the electrons trapped in the DTs at the oxide-SiC interface. In this case, the device performance may be severely affected since the uncompensated DTs lead to a very high threshold voltage (around 20-40 V).

Referring again to FIG. 4, the step 302 of introducing an oxidation rate enhancing agent is followed by the step 303 of post oxidation anneal (POA) in a hydrogen containing environment to remove the introduced oxidation rate enhancing agent (when necessary) and to passivate the DTs in order to reduce the threshold voltage. Below, the effect of the POA will be described for the case when sodium is used as an oxidation rate enhancing agent, with reference to FIGS. 5b-5c.

Figure 5B:
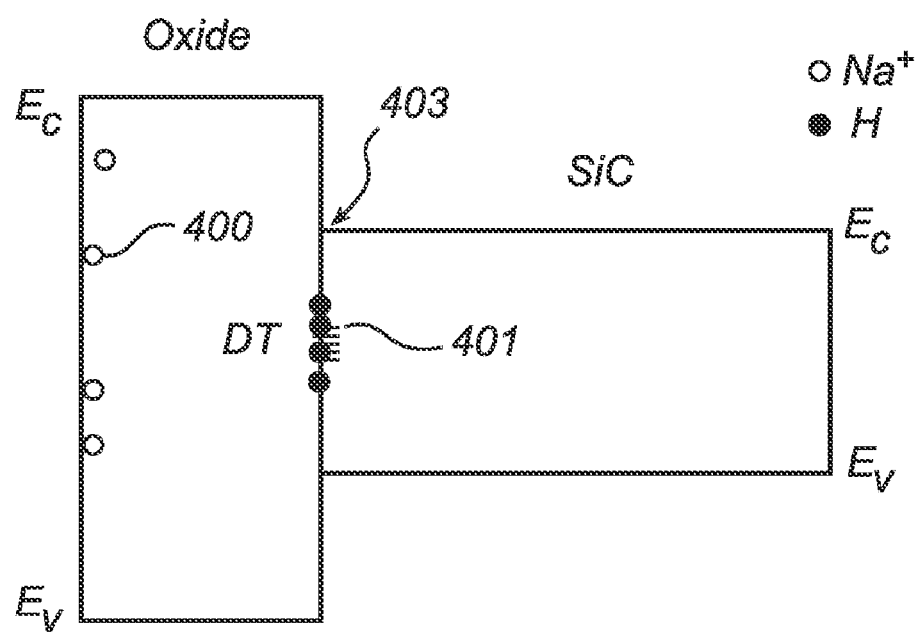

FIG. 5b schematically illustrates the situation after post-oxidation anneal of sodium contaminated oxide in forming gas (Ar/H$_2$). The anneal is done in a clean furnace free from sodium (after chlorine clean). During the annealing, sodium 400 diffuses out while hydrogen 401 diffuses into the oxide. The hydrogen 401 replaces the sodium at the interface 403 and forms a passive complex with the deep traps (DTs). The hydrogen passivation of the DTs is more stable than the Coulombic attraction between positively charged sodium and the negatively charged deep trap. During cooling of the samples there are no sites available for the sodium at the oxide-SiC interface 403 and the remaining sodium 400 diffuses towards the surface 404 of the oxide. The remainder of the sodium 400 may be removed from the oxide layer through continued anneal or, alternatively, by etching off part of the oxide layer.

When annealing the oxide directly in forming gas (Ar/H$_2$), the anneal should take place at a sufficiently high temperature to ensure out-diffusion of Na and in-diffusion of hydrogen to passivate the deep traps. According to an example of the present first embodiment, the oxidized SiC-substrate was annealed at 750° C. for 18 hours in Ar/H$_2$. The sample was ramped down in nitrogen from 500° C. to room temperature. Thereafter 5 nm of the surface oxide layer was removed in buffered HF solution in order to etch away sodium near the sample surface. C-V analysis showed that the sample was free from sodium and about 70% of the deep traps were passivated by hydrogen. Further post-oxidation anneal at 400° C. in Ar/H$_2$ (Ar 90%, H$_2$ 10%) for 30 min increased the passivation of the deep traps to 90% (DT<$7\times10^{11}$ cm$^{-2}$). More studies are needed to find the optimum temperature of the forming gas annealing but it appears to be close to 400° C.

Figure 5C:
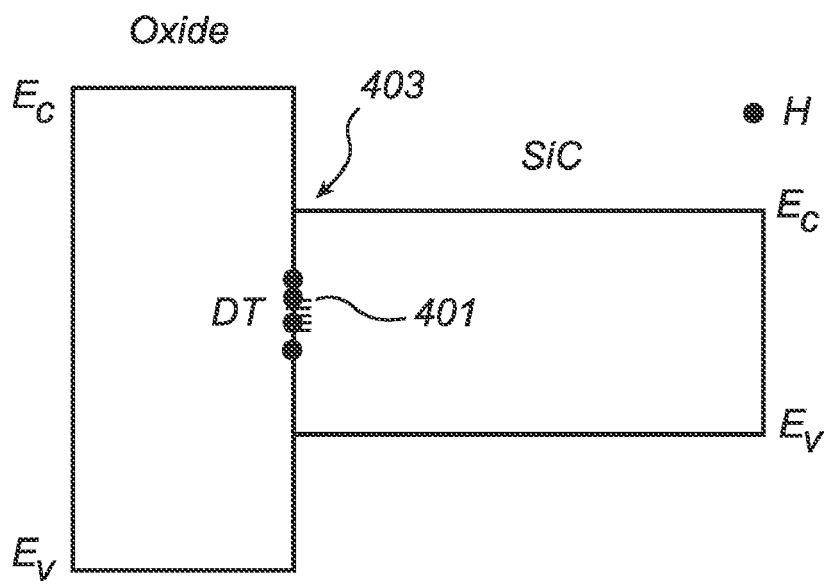

FIG. 5c schematically shows the situation after removing the sodium residue from the oxide through continued anneal or etching of the top surface layer of the oxide (50-100 Å). The sodium concentration is below the detection limit and most of the deep traps are passivated by hydrogen 401.

The resulting gate oxide contains low concentrations of sodium, near-interface traps (NITs) and deep traps (DT). These oxide properties lead to stable high channel mobility devices having a low threshold voltage.

Figure 6:
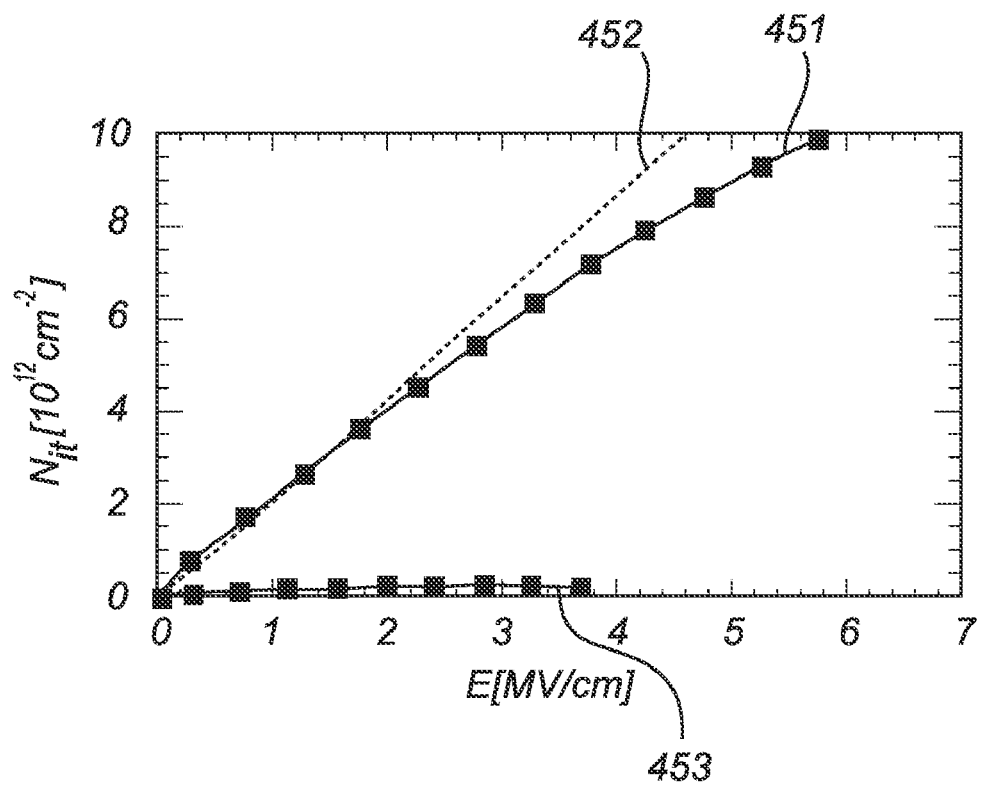
FIG. 6 is a diagram which illustrates the reduction in the density of near interface traps achieved through the method according to the invention.

FIG. 6 is a diagram which illustrates the reduction in density of near interface traps achieved using the first embodiment of the method according to the invention.

In FIG. 6 the number density of electrons trapped in near-interface traps (NITs) as a function of the electric field across the oxide is shown for oxides grown on the Si-face of 4H—SiC using conventional oxidation and post-oxidation anneal (POA) and the method according to the present invention, respectively. The curve 451 for the conventionally grown oxides, together with the dotted curve 452 illustrating the total accumulation charge available in the MOS capacitors, shows that almost all the electrons in the accumulation layer get trapped in NITs. For the oxides grown using the method according to the present invention, on the other hand, the density of electrons trapped in NITs is below $5\times10^{11}$ cm$^{-2}$ and practically unaffected by the electric field across the oxide, as illustrated by the curve 453. The field effect mobility ($\mu_{FE}$) in transistors made using these oxides is highly correlated with the NIT-densities illustrated by the curves 451, 453 in FIG. 6. Using the conventionally grown oxides, an inversion layer mobility of about 2 cm$^2$/Vs is achieved, while the oxide manufactured according to the method of the present invention yields an inversion layer mobility of about 100 cm$^2$/Vs.

Figure 7:
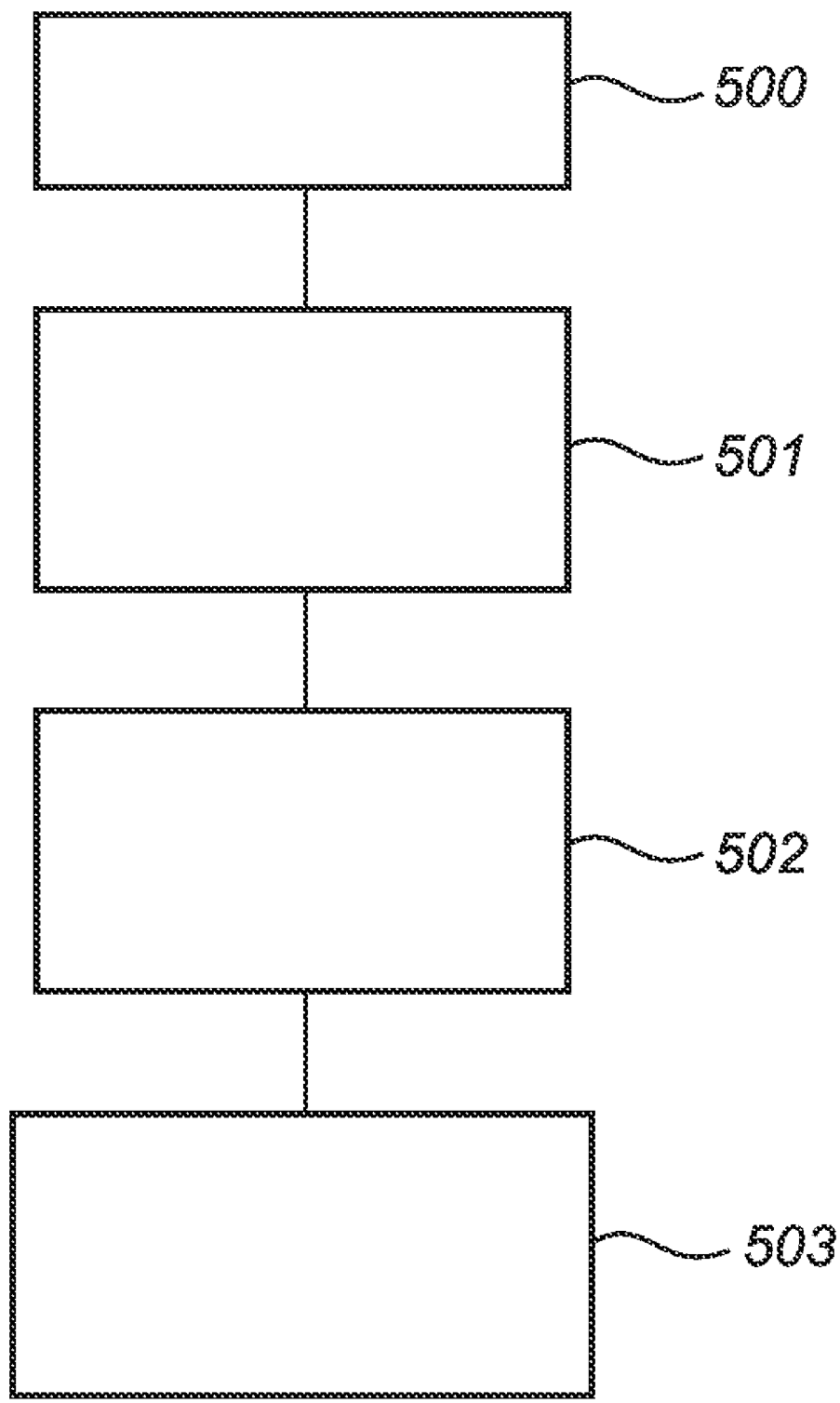
FIG. 7 is a flow-chart schematically illustrating a second embodiment of the method according to the present invention.

In FIG. 7, an alternative method of achieving oxidation at an oxidation rate sufficiently high to achieve a density of NITs below $5\times10^{11}$ cm$^{-2}$ is illustrated, where a first step 500 of providing a SiC-substrate is followed by a step 501 of performing ion implantation on the Si-face of the provided SiC-substrate. In a subsequent step 502, the ion-implanted SiC-substrate is oxidized in an oxidation chamber. Finally, in step 503, the oxidized SiC-substrate is annealed in a hydrogen-containing environment in order to passivate the deep traps (DTs) formed in the oxide-forming step 502 and, when necessary, remove implanted ions from the oxide.

The present inventors have performed experiments to implant 16 different chemical elements into the SiC before oxidation. In all cases enhanced oxidation rate of the SiC was noted and formation of deep traps was observed. The primary reason for the enhanced oxidation rate is believed to be lattice damage due to the implantation. In some cases the presence of the foreign elements (especially alkali ions and transition metals) may also influence the oxidation rate. If a native element, such as, Si is used in this method, the purpose of the post-oxidation anneal is only to introduce hydrogen into the sample to passivate the DTs.

The person skilled in the art realises that the present invention by no means is limited to the preferred embodiments. For example, other anneal temperatures, hydrogen containing gas mixtures and times than those stated above may be used to passivate the deep traps formed at oxidation.

In short, the invention provides a method of manufacturing a semiconductor device based on a SiC substrate (12), comprising the steps of forming (201) an oxide layer (14) on a Si-terminated face of the SiC substrate (12) at an oxidation rate sufficiently high to achieve a near interface trap density below $5 \times 10^{11}$ cm$^{-2}$; and annealing (202) the oxidized SiC substrate in a hydrogen-containing environment, in order to passivate deep traps formed in the oxide-forming step, thereby enabling manufacturing of a SiC-based MOSFET (10) having improved inversion layer mobility and reduced threshold voltage. It has been found by the present inventors that the density of DTs increases while the density of NITs decreases when the Si-face of the SiC substrate is subject to rapid oxidation. According to the present invention, the deep traps formed during the rapid oxidation can be passivated by hydrogen annealing, thus leading to a significantly decreased threshold voltage for a semiconductor device formed on the oxide

The invention claimed is:

1. A method of manufacturing a semiconductor device based on a SiC substrate, comprising:
    forming an oxide layer on a Si-terminated face of said SiC substrate at an oxidation rate sufficiently high to achieve a near interface trap density below $5 \times 10^{11}$ cm$^{-2}$; and
    annealing said oxidized SiC substrate in a hydrogen-containing environment, in order to passivate deep traps formed in said oxide-forming step, thereby enabling manufacturing of a SiC-based MOSFET having improved inversion layer mobility and reduced threshold voltage.

2. The method of manufacturing a semiconductor device based on a SiC substrate according to claim 1, wherein said oxidation rate has a maximum which is at least 700 Angstrom per hour at a temperature of 1150 degrees C.

3. The method of manufacturing a semiconductor device based on a SiC substrate according to claim 1, wherein said sufficiently high oxidation rate is achieved by means of an oxidation rate enhancing agent.

4. The method of manufacturing a semiconductor device based on a SiC substrate according to claim 3, wherein said oxidation rate enhancing agent is introduced in an oxidation chamber during oxidation of said Si-terminated face of said SiC substrate.

5. The method of manufacturing a semiconductor device based on a SiC substrate according to claim 3, wherein said oxidation rate enhancing agent is an alkali metal.

6. The method of manufacturing a semiconductor device based on a SiC substrate according to claim 5, wherein said oxidation rate enhancing agent is sodium.

7. The method of manufacturing a semiconductor device based on a SiC substrate according to claim 1, wherein said oxide-forming step comprises:
    providing said SiC substrate in an oxidation chamber; and
    introducing sodium into said oxidation chamber during oxidation of a Si-terminated face of said SiC-substrate, thereby achieving a sufficiently high oxidation rate to reduce the density of near interface traps to below $5 \times 10^{11}$ cm$^{-2}$.

8. The method of manufacturing a semiconductor device based on a SiC substrate according to claim 7, wherein said annealing step comprises:
    subjecting said oxidized SiC substrate to a first post-oxidation anneal in an inert gas, to reduce an amount of mobile sodium in said oxidized SiC substrate; and
    subjecting said sodium reduced oxidized SiC substrate to a second post-oxidation anneal in a hydrogen-containing environment, in order to passivate said deep traps.

9. A semiconductor device comprising:
    a SiC substrate having a Si-terminated face; and
    an oxide layer formed on said Si-terminated face of said SiC substrate, wherein:
    a concentration of near interface traps at an interface between said SiC substrate and said oxide is lower than $5 \times 10^{11}$ cm$^{-2}$; and
    a concentration of passivated deep traps at said interface is in excess of $10^{12}$ cm$^{-2}$.

* * * * *